United States Patent [19]

Kaku et al.

[11] Patent Number: 5,448,595
[45] Date of Patent: Sep. 5, 1995

[54] AUTOMATIC GAIN CONTROL CIRCUIT FOR A DEMODULATION SECTION OF A MODEM

[75] Inventors: Takashi Kaku; Hiroyasu Murata; Tohru Ogawa, all of Kawasaki, Japan

[73] Assignee: Fujitsu Limited, Kawasaki, Japan

[21] Appl. No.: 109,044

[22] Filed: Aug. 19, 1993

[30] Foreign Application Priority Data

Feb. 15, 1993 [JP] Japan .................................. 5-025056

[51] Int. Cl.⁶ ............................................. H04L 27/08
[52] U.S. Cl. ..................... 375/345; 375/222; 455/236.1; 330/278
[58] Field of Search ............... 375/8, 98; 455/72, 245, 455/236.1, 245.1, 237.1, 249.1; 330/278

[56] References Cited

U.S. PATENT DOCUMENTS

| | | | |
|---|---|---|---|
| 4,458,355 | 7/1984 | Motley et al. | 375/98 X |
| 4,884,141 | 11/1989 | Hyakutake | 358/174 |
| 4,969,145 | 11/1990 | Maruyama et al. | 375/98 X |
| 5,050,192 | 9/1991 | Nawata | 375/98 |
| 5,065,410 | 11/1991 | Yoshida et al. | 375/98 |

FOREIGN PATENT DOCUMENTS

0135154 3/1985 European Pat. Off. .
0431435 6/1991 European Pat. Off. .

Primary Examiner—Stephen Chin
Assistant Examiner—Bryan Webster
Attorney, Agent, or Firm—Staas & Halsey

[57] ABSTRACT

An automatic gain control circuit which is provided in a demodulation section of a modem to adjust the loop gain so that the level of a band-limited receive signal may have a predetermined reference value and to output the receive signal to an automatic equalization section of the modem. The automatic gain control circuit is improved in that, even when a disturbance of the circuit such as a gain hit or a drop-out occurs, regular communication can be continued without requiring a data mode leading-in operation. The automatic gain control circuit includes a reference value setting unit for generating a reference value, an error calculation unit for determining an error signal between the receive signal and the reference value, a receive level variation correcting controlling force setting unit for setting a receive level variation correcting controlling force to be added to the error signal, an error signal correction unit for correcting the error signal, an error signal averaging unit for averaging the corrected error signal and a feedback unit for feeding back, as the receive signal, the averaged corrected error signal. The receive level variation correcting controlling force to be set by the receive level variation correcting controlling force setting unit is varied in response to the error signal.

13 Claims, 7 Drawing Sheets

AUTOMATIC GAIN CONTROL CIRCUIT FOR A DEMODULATION SECTION OF A MODEM

BACKGROUND OF THE INVENTION

This invention relates to an automatic gain control circuit which is provided in a demodulation section of a modem (modulator-demodulator) to adjust the loop gain so that the level of a band-limited receive signal may have a predetermined reference value and supplies the output signal to an automatic equalization section.

The transmission speed has exhibited a remarkable increase in recent years, and as the increase of the transmission speed progresses, it becomes increasingly necessary to reduce the occurrence of errors in data communication arising from disturbances of the circuit to as few as possible. Further, when an error in data communication actually occurs, a modem is required to follow up the condition of the circuit in a short time.

Figure 7:
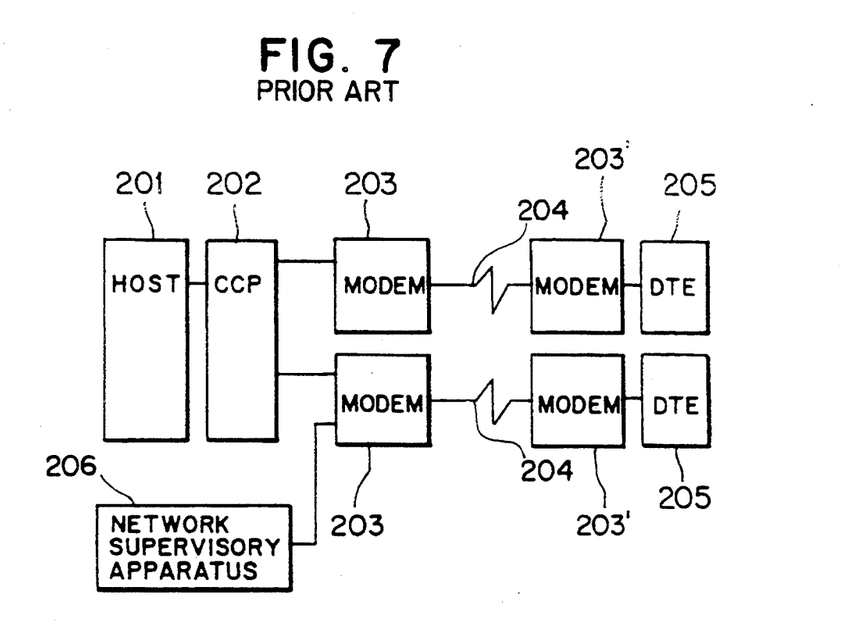
FIG. 7 is a block diagram showing an on-line system.

FIG. 7 shows a general construction of an on-line system. Referring to FIG. 7, in the on-line system shown, a plurality of modems 203 are connected to a host computer 201 by way of a communication control apparatus (CCP) 202, and each of the modems 203 is connected by way of an analog circuit 204 to another modem 203' installed at another location. A terminal 205 is connected to each of the modems 203'.

The on-line system further includes a network supervisory apparatus 206, for which a secondary channel is used.

By the way, a state signal of a modem can be transmitted from each of the host side modems 203 shown in FIG. 7, as it is to the network supervisory apparatus 206. But from each of the terminal side modems 203', a state signal thereof is transmitted to the associated host side modem 203 so that it is transmitted by way of the modem 203 to the network supervisory apparatus 206.

Figure 8:
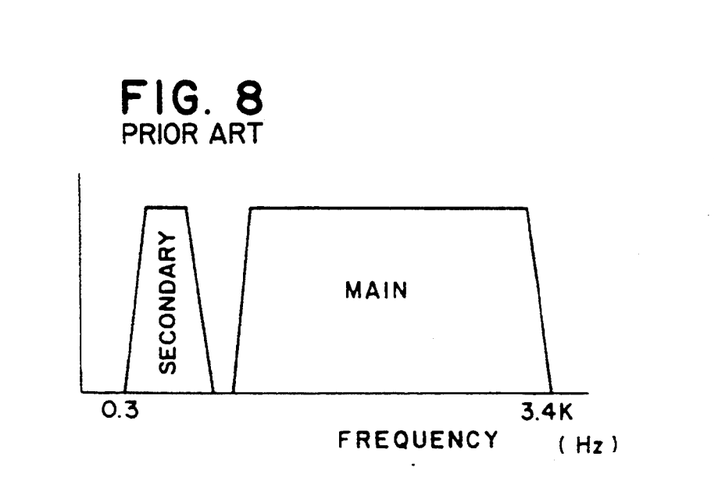
FIG. 8 is a diagram showing frequency bands of a main channel and a secondary channel used in the on-line system shown in FIG, 7.

Since a state signal of a modem must necessarily be transmitted without having any influence on main data, each of the modems 203 and 203' divides, for example, a voice band of 0.3 kHz to 3.4 kHz by frequency division to provide a secondary channel for secondary data in addition to a main channel for main data as seen in FIG. 8.

It is to be noted that phase shift keying (PSK), orthogonal amplitude modulation (QAM) or some other modulation is used for a main signal while frequency shift keying (FSK) is used for a secondary signal.

Each of the modems includes, in its reception section, in addition to a demodulation section, a roll-off filter, an automatic gain control section (AGC), an automatic equalization section (AEQ), a carrier phase correction section (CAPC), a timing extraction section, a carrier detection section and so forth. Particularly, the automatic gain control section functions as an automatic gain control circuit for adjusting the loop gain so that the level of a band-limited demodulation signal may be equal to a predetermined reference value, and for inputting the demodulation signal to the automatic equalization section. The automatic gain control section is necessary in order to cause the automatic equalization section to operate regularly.

Such modems are constructed such that, once a disturbance of the circuit such as a gain hit or a drop-out occurs to cause a data error, they restore their normal state through a data mode leading-in operation.

With such modems, however, once a disturbance of the circuit such as a gain hit or a drop-out occurs as described above, they sometimes enter into a data mode leading-in operation. Thus, there is a concern in that, once such data mode leading-in operation is entered, no communication can be performed for the period of time of the operation.

In this instance, the period of time does not matter with a modem of the low speed type since the time required for recovery after starting of a data mode leading-in operation is short, but it cannot be ignored with a modem of the high speed type since the time required for recovery is long.

Also, a method of decreasing the time required for recovery after starting of a data mode leading-in operation is available, however, a large scale is required for a hardware or software construction for realizing the method.

SUMMARY OF THE INVENTION

It is an object of the present invention to provide an automatic gain control circuit for a demodulation section for a modem which allows, even when a disturbance of the circuit such as a gain hit or a drop-out occurs, regular communication to be continued without requiring a data mode leading-in operation.

In order to attain the object described above, according to the present invention, there is provided an automatic gain control circuit which is provided in a demodulation section of a modem to adjust the loop gain so that the level of a band-limited receive signal may have a predetermined reference value and output the receive signal to an automatic equalization section of the modem. The automatic gain control circuit comprises reference value setting means for setting the reference value, error calculation means for calculating an error signal between output signal level information of the automatic gain control circuit corresponding to the input receive signal and the reference value of the reference value setting means, receive level variation correcting controlling force setting means for setting a receive level variation correcting controlling force to be added to the error signal calculated by the error calculation means, error signal correction means for correcting the error signal from the error calculation means with the receive level variation correcting controlling force set by the receive level variation correcting controlling force setting means, error signal averaging means for averaging the corrected error signal and feedback means for feeding back, as the input receive signal to the automatic gain control circuit, the averaged corrected error signal, the receive level variation correcting controlling force to be set by the receive level variation correcting controlling force setting means and varied in response to the error signal from the error calculation means.

The receive level variation correcting controlling force setting means may include averaging means for averaging the error signal calculated by the error calculation means, and averaged error signal squaring means for squaring the error signal averaged by the averaging means and outputting the squared error signal as the receive level variation correcting controlling force.

in this instance, the receive level variation correcting controlling force setting means may further include minimum value setting means provided on the output side of the averaged error signal squaring means for setting a minimum value so that the output of the averaged error signal squaring means may not be lower than a preset minimum value.

Or, the receive level variation correcting controlling force setting means may further include means provided on the output side of the averaged error signal squaring means for setting a different value depending upon a difference in reception mode of the modem.

Or else, the receive level variation correcting controlling force setting means may further include minimum value setting means provided on the output side of the averaged error signal squaring means for setting a minimum value so that the output of the averaged error signal squaring means may not be lower than a preset minimum value, and means provided on the output side of the averaged error signal squaring means for setting a different value depending upon a difference in reception mode of the modem.

Preferably, information obtained by squaring an output level is used as output level information to be inputted to the error calculation means.

The automatic gain control circuit may further comprise error signal averaging means for averaging the error signal corrected with the receive level variation correcting controlling force set by the receive level variation correcting controlling force setting means, the averaged error signal from the error signal averaging means being fed back as the input signal to the automatic gain control circuit.

In this instance, the automatic gain control circuit may further comprise limiter means for setting an upper limit value and a lower limit value to the input of the error signal averaging means.

Or, the automatic gain control circuit may further comprise means for adding the averaged error signal from the error signal averaging means as the correcting controlling force to the error signal calculated by the error calculation means.

With the automatic gain control circuit for a demodulation section of a modem of the present invention, when a variation of the receive level occurs, feedback control is performed in accordance with the magnitude of the variation so that the output signal of the automatic gain control circuit can be kept at a fixed level. Consequently, there is an advantage in that occurrence of a data error is eliminated. Further, since this eliminates the modem from entering into a data mode leading-in operation, there is another advantage in that an erroneous operation of the automatic equalization section at the next stage is prevented. In addition, since the frequency in which the modem enters into a data mode leading-in operation is reduced, there is a further advantage in that the frequency in which the communication is disabled is reduced.

Further objects, features and advantages of the present invention will become apparent from the following detailed description when read in conjunction with the accompanying drawings in which like parts or elements are denoted by like reference characters.

DESCRIPTION OF THE PREFERRED EMBODIMENTS a. Principle of the Present Invention

Prior to a description of a preferred embodiment of the present invention, the principle of the present invention will be described first.

Figure 1:
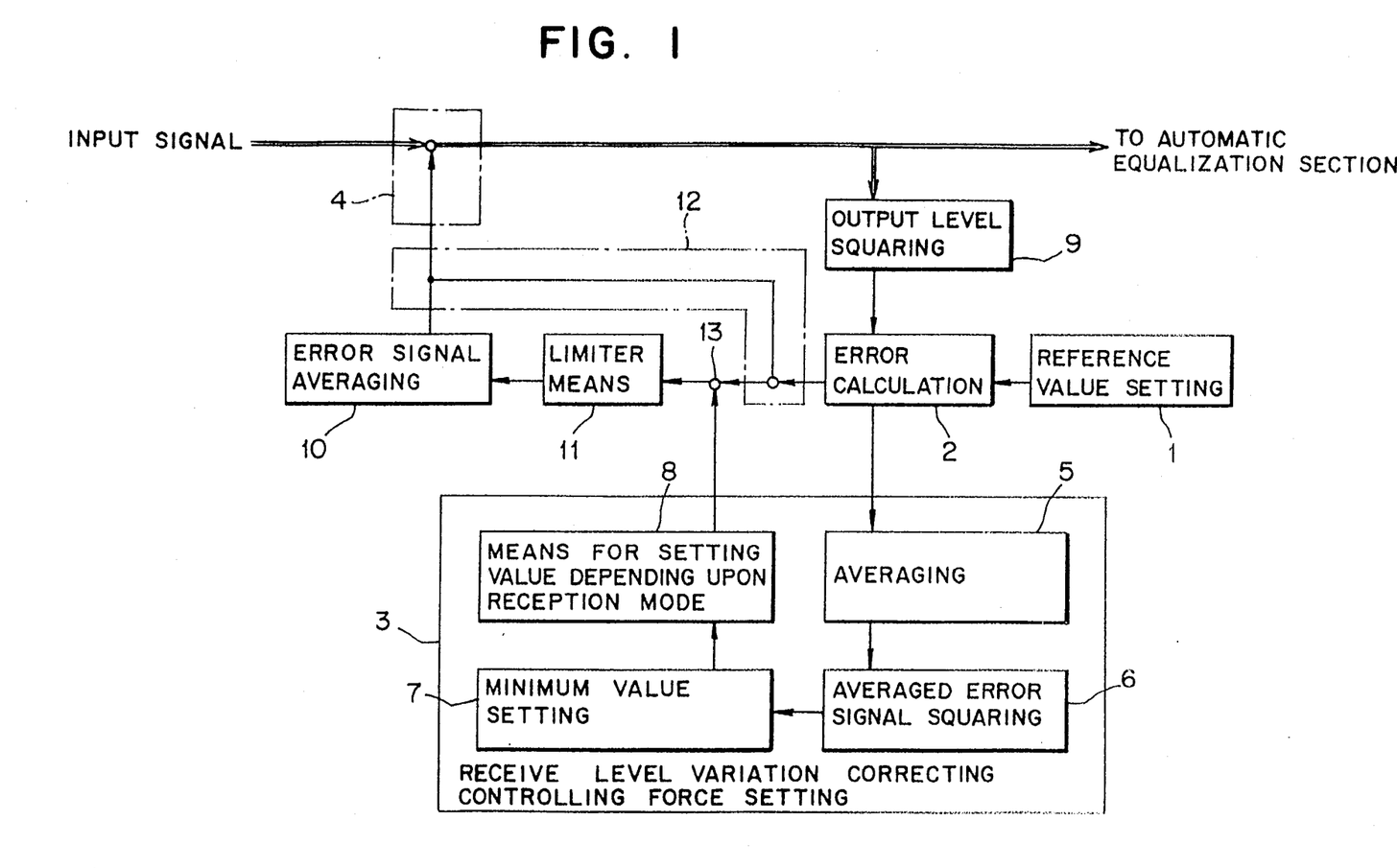
FIG. 1 is a block diagram illustrating the principle of the present invention.

FIG. 1 illustrates, in block diagram, the principle of an automatic gain control circuit for a demodulation section of a modem of the present invention. Referring to FIG. 1, the automatic gain control circuit includes reference value setting means 1 for setting a reference value, and error calculation means 2 for calculating an error between output signal level information and the reference value of the reference value setting means 1.

The automatic gain control circuit further includes receive level variation correcting controlling force setting means 3 for setting a receive level variation correcting controlling force to be added to the error signal calculated by the error calculation means 2. The receive level variation correcting controlling force setting means 3 varies the receive level variation correcting controlling force in response to the error signal from the error calculation means 2. The automatic gain control circuit further includes error signal correction means 13 for correcting the error signal from the error calculation means 2 with the receive level variation correcting controlling force set by the receive level variation correcting controlling force setting means 3.

Feedback means 4 feeds back, as the input signal to the automatic gain control circuit, the error signal corrected by the error signal correction means 13.

The receive level variation correcting controlling force setting means 3 may include averaging means 5 for averaging the error signal calculated by the error calculation means 2, and averaged error signal squaring means 6 for squaring the error signal averaged by the averaging means 5 and outputting the squared error signal as a receive level variation correcting controlling force. Further, in this instance, minimum value setting means 7 for setting a minimum value so that the output of the averaged error signal squaring means 6 may not be lower than a preset minimum value may be provided on the output side of the averaged error signal squaring means 6, and/or means 8 for setting a different value depending upon a difference in reception mode of the modem may be provided on the output side of the averaged error signal squaring means 6.

Meanwhile, output level squaring means 9 for outputting information obtained by squaring an output level of the automatic gain control circuit as output level information may be provided on the input side of the error calculation means 2.

Further, error signal averaging means 10 for averaging the error signal corrected with the receive level variation correcting controlling force set by the receive level variation correcting controlling force setting means 3 may be provided, and in this instance, limiter means 11 for setting an upper limit value and a lower limit value to the input of the error signal averaging means 10 may be provided, or means 12 for adding the averaged error signal from the error signal averaging means 10 as a correcting controlling force to the error signal calculated by the error calculation means 2 may be provided.

In the automatic gain control circuit for a demodulation section of a modem according to the present invention described above, the error calculation means 2 calculates an error of output signal level information of the automatic gain control circuit from a reference value set by the reference value setting means 1, and the receive level variation correcting controlling force setting means 3 sets, in response to the error signal from the error calculation means 2, a receive level variation correcting controlling force to be added to the error signal. Then, the feedback means 4 feeds back to the input signal of the automatic gain control circuit the error signal corrected with the receive level variation correcting controlling force set by the receive level variation correcting controlling force setting means 3 to adjust the loop gain so that the level of a demodulation or receive signal may be equal to the predetermined reference value.

Where the receive level variation correcting controlling force setting means 3 includes the averaging means 5 and the averaged error signal squaring means 6, the averaging means 5 averages the error signal calculated by the error calculation means 2, and the averaged error signal squaring means 6 squares the error signal averaged by the averaging means 5 and outputs the squared error signal as a receive level variation correcting controlling force. Further, in this instance, where the minimum value setting means 7 is provided on the output side of the averaged error signal squaring means 6, the minimum value setting means 7 sets a minimum value so that the output of the averaged error signal squaring means 6 may not become smaller than a preset minimum value, and where the means 8 for setting a different value depending upon a difference in reception mode of the modem is provided on the output side of the averaged error signal squaring means 6, a different value can be set depending upon a difference in reception mode of the modem by the setting means 8.

Meanwhile, where the output level squaring means 9 is provided on the input side of the error calculation means 2, information obtained by squaring the output level is used as output level information to be inputted to the error calculation means 2.

Further, where the error signal averaging means 10 is provided, it averages the error signal corrected with the receive level variation correcting controlling force set by the receive level variation correcting controlling force setting means 3, and the average error signal from the error signal averaging means 10 is fed back as the input signal to the automatic gain control circuit. Further, in this instance, where the limiter means 11 is provided, it sets an upper limit value and a lower limit value to the input to the error signal averaging means 10, and where the means 12 for adding the averaged error signal from the error signal averaging means 10 as a correcting controlling force to the error signal calculated by the error calculation means 2 is provided, the means 12 adds the averaged error signal from the error signal averaging means 10 as a correcting controlling force to the error signal calculated by the error calculation means 2.

As described above, with the automatic gain control circuit for a demodulation section of a modem of the present invention, when a variation in receive level occurs, feedback control is performed in accordance with the magnitude of the variation so that the output signal of the automatic gain control circuit can be kept at a fixed level. Consequently, the automatic gain control circuit for a demodulation section of a modem is advantageous in that occurrence of a data error is eliminated and consequently the modem does not enter into a data mode leading-in operation and an erroneous operation of another circuit at a following stage is not invited. Further, the frequency in which a disabled condition of communications is entered is reduced since the modem enters into a data mode leading-in operation less frequently.

b. Description of a Preferred Embodiment

Figure 2:
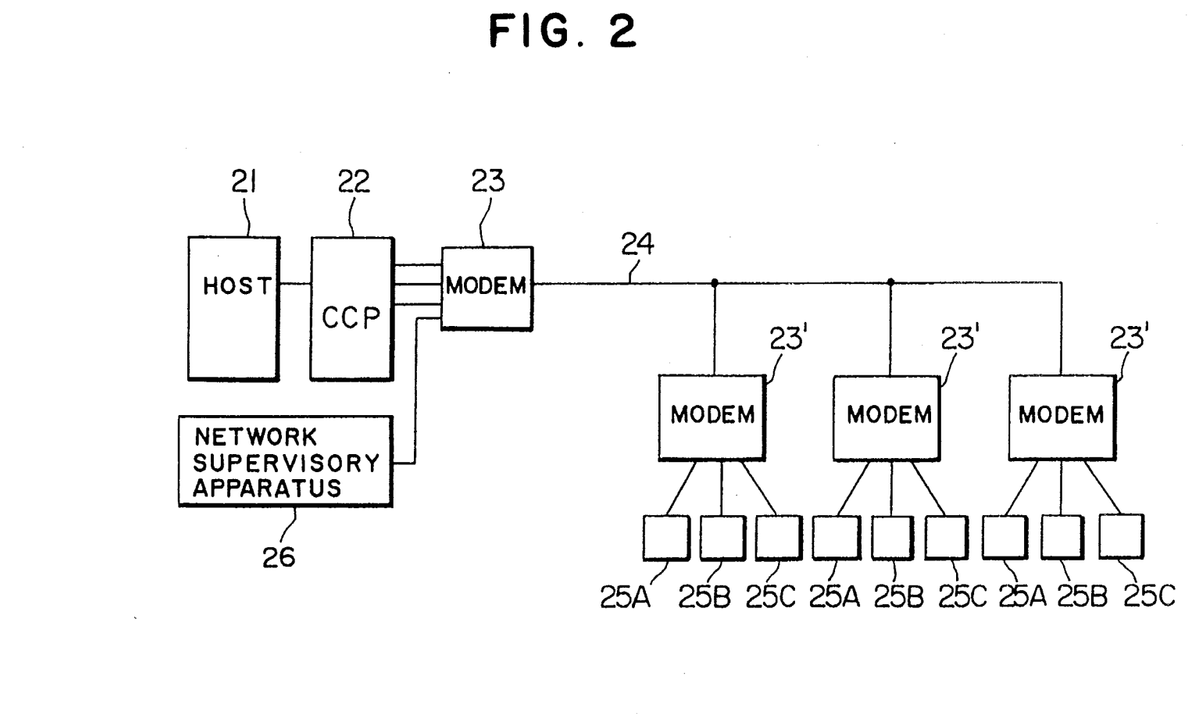
FIG. 2 is a block diagram of an on-line system to which the present invention is applied.

Now, a preferred embodiment of the present invention is described in detail. Referring first to FIG. 2, there is shown an on-line system to which the present invention is applied. The on-line system shown includes a modem 23 connected to a host computer 21 by way of a communication control apparatus (CCP) 22 and serving as a parent station. A plurality of modems 23' are connected to the modem 23 by way of an analog circuit 24. The modems 23' are installed at different locations from the modem 23 and each serves as a child station. A plurality of terminals 25A to 25C are connected to each modem 23'. The on-line system further includes a network supervisory apparatus 26.

Figure 5:
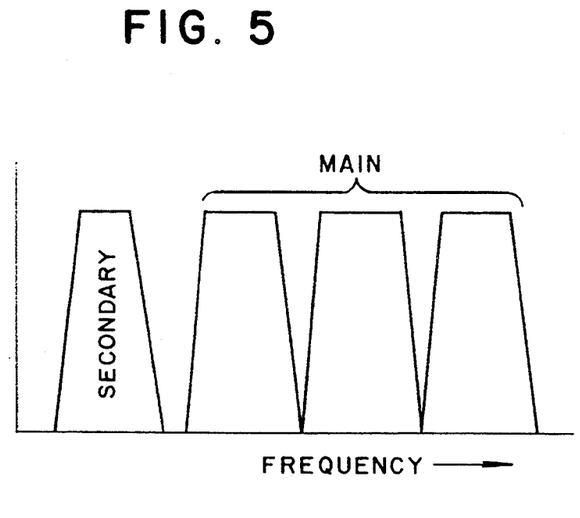
FIG. 5 is a diagram showing frequency bands of a main channel and a secondary channel used in the on-line system of FIG. 2.

Each of the modems 23 and 23' divides a voice band, for example, into three main channels for main data and a secondary channel for secondary data for network supervision as shown in FIG. 5 by frequency division and generates, upon transmission, signal points having a predetermined eye pattern to modulate and transmit data (main data and secondary data), whereas it demodulates, upon reception, a reception signal to reproduce data (main data and secondary data). Thus, as shown in FIG. 2, the child station modems 23' can be connected by multi-point connection to the parent station modem 23 by way of the; common analog circuit 24.

Figure 3:
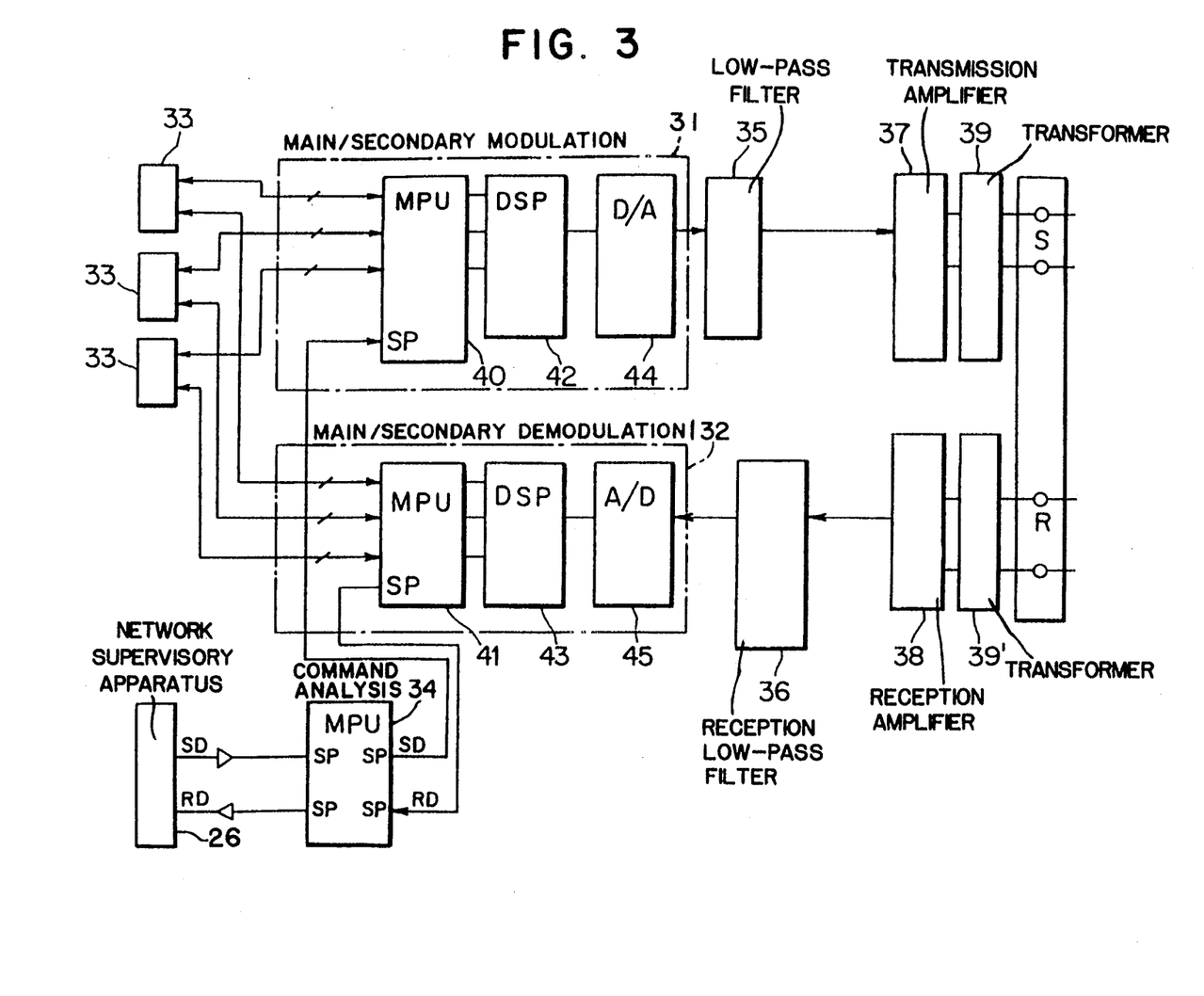
FIG. 3 is a block diagram of an essential part of a modem in which an automatic gain control circuit according to the present invention is incorporated.

Referring now to FIG. 3, in order for the modem 23 to exhibit such functions as described just above, it includes a main/secondary modulation section 31 and a main/secondary demodulation section 32, and further includes a plurality of interface sections 33 with the communication control apparatus 22, and a command analysis section 34 interposed between the modem 23 and the network supervisory apparatus 26. The modem 23 further includes a transmission low-pass filter 35, a reception low-pass filter 36, a transmission amplifier 37, a reception amplifier 38 and a pair of transformers 39 and 39'.

Each of the interface sections 33 connects the communication control apparatus 22 and the modem 23 to each other with a synchronous interface (RS232C). The command analysis section 34 performs an analysis of a command from the network supervisory apparatus 26 and production of a response to the network supervisory apparatus 26 and has a function of transferring transmission or reception data SD or RD by way of serial ports SP thereof by high speed serial transfer.

Further, the command analysis section 34 connects the network supervisory apparatus 26 and the modem 23 to each other with a start-stop interface (RS485).

The main/secondary modulation section 31 includes a microprocessor unit (MPU) 40, a digital signal processor (DSP) 42 and a digital to analog (D/A) converter 44. The main/secondary demodulation section 32 includes an MPU 41, a DSP 43 and an analog to digital (A/D) converter 45. The MPUs and DSPs constituting the main/secondary modulation section 31 and the main/secondary demodulation section 32 may individually be provided by suitable plural numbers depending upon the capacity or processing faculty of the modem 23.

Figure 4:
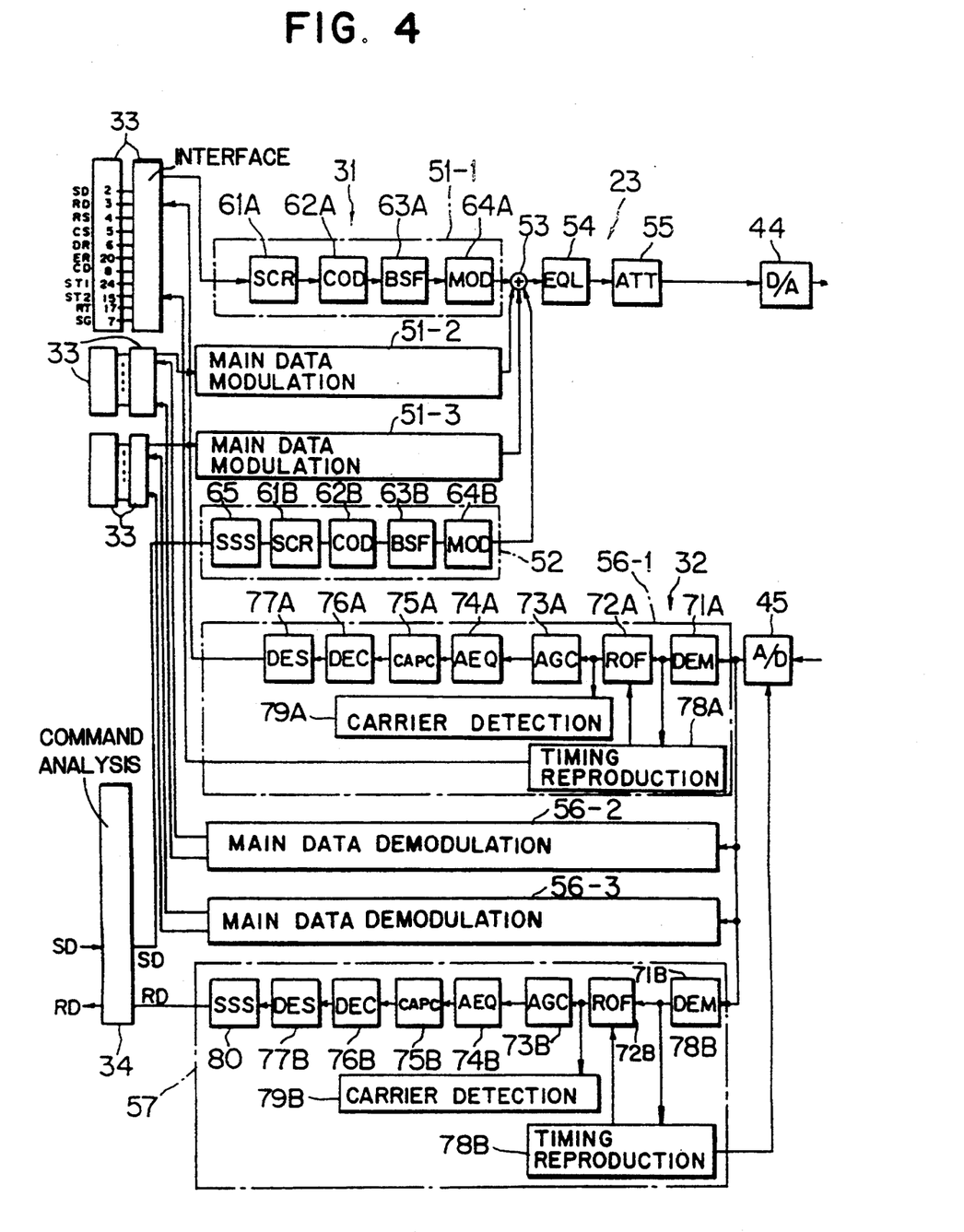
FIG. 4 is a block diagram showing details of the modem shown in FIG. 3.

Now, an essential part of the modem 23 will be described in more detail. Referring now to FIG. 4, the modem 23 includes, in the main/secondary modulation section 31, three main data modulation sections 51-1, 51-2 and 51-3 and a secondary data modulation section 52 as well as an addition section 53, a fixed equalizer 54 and a transmission attenuator 55.

The main data modulations section 51-1 to 51-3 modulate main data and are provided by a number equal to the number of channels, that is, 3. Each of the main data modulation sections 51-1 to 51-3 includes a scrambler 61A, a code conversion section 62A, a transmission base band filter 63A and a modulation section 64A. It is to be rioted that, while the detailed construction is shown only of the main data modulation section 51-1 in FIG. 4, also the other main data modulation sections 51-2 and 51-3 have the same construction as described above.

Here, the scrambler 61A scrambles a signal into a random signal, and the code conversion section 62A performs desired code conversion for the output of the scrambler 61A. Upon such code conversion, the code conversion section 62A generates a signal point having a desired eye pattern (data point plot pattern on a phase plane).

The transmission base band filter 63A passes a base band component of a digital output of the code conversion section 62A, and the modulation section 64A modulates the output of the base band filter 63A with a corresponding main channel frequency.

Meanwhile, the secondary data modulation section 52 modulates secondary data and includes a start-stop synchronization conversion section 65, a scrambler 61B, a code conversion section 62B, a transmission base band filler 63B, and a modulation section 64B.

Here, the start-stop synchronization conversion section 65 performs conversion processing from a start-stop interface to a synchronization interface, and the scrambler 61B, the code conversion section 62B, the transmission base band filter 63B and the modulation section 64B have similar functions to those of the scrambler 61A, the code conversion section 62A, the transmission base band filter 63A and the modulation section 64A, respectively. It is to be noted that the modulation frequency at the modulation section 64B is the secondary channel frequency.

It is to be noted that the transmission MPU 40 shown in FIG. 3 has the functions of the scramblers 61A and the code conversion sections 62A of the main data conversion sections 51-1 to 51-3 and the start-step synchronization conversion section 65, the scrambler 61B and the code conversion section 62B of the secondary data conversion section 52, and the transmission DSP 42 shown in FIG. 3 has the functions of the transmission base band filters 63A and the modulation sections 64A of the main data conversion sections 51-1 to 51-3, the base band filter 63B and the modulation section 64B of the secondary data conversion section 52, the addition section 53, the fixed equalizer 54 and the transmission attenuator 55.

Further, the modem 23 includes, in the main/secondary modulation section 32, three main data demodulation sections 56-1, 56-2 and 56-3 and a secondary data demodulation section 57.

The main data demodulation sections 56-1 to 56-3 demodulate main data and are provided also by a number equal to the number of channels, that is, 3. Each of the main data demodulation sections 56-1 to 56-3 includes a demodulation section 71A, a roll-off filter (band separation filter) 72A, an automatic gain control section 73A, an automatic equalization section 74A, a carrier phase correction section 75A, a code conversion section 76A and a descrambler 77A as well as a timing reproduction section 78A and a carrier detection section 79A. It is to be noted that, while only the detailed construction is shown only of the main data demodulation section 56-1 in FIG. 4, also the other main data demodulation sections 56-2 and 56-3 have the same construction as described above.

Here, the demodulation section 71A applies demodulation processing to a reception signal after digital conversion by the A/D converter 45, and the roll-off filter 72A passes only a signal of a predetermined frequency range of the digital output of the demodulation section 71A. A transversal filter is used for the demodulation section 71A. Further, where the main channel is divided into a plurality of (three) channels as in the present embodiment, the frequency cut-off characteristic of the roll-off filter 72A must necessarily be set steep from the necessity to narrow the band widths to make a rigid distinction between each adjacent frequencies, and to this end, the roll-off rate (ROF rate) of the roll-off filter 72A is set low (for example, to 3 to 5% or so).

The automatic gain control section 73A constitutes automatic receive level adjustment means for adjusting the loop gain so that the level of the demodulation signal or receive signal band-limited by the roll-off filter 72A may be equal to a predetermined reference value, and for inputting the modulation signal to the automatic equalization section 74A at the next stage. The automatic gain control section 73A allows the automatic equalization section 74A at the next stage to operate accurately.

The automatic equalization section 74A performs equalization processing for correcting a transmission distortion and so forth of the circuit, and the carrier phase correction section 75A corrects the phase of a carrier from the output of the automatic equalization section 74A The code conversion section 76A decodes a coded signal of the output of the carrier phase correction section 75A, and the descrambler 77A descrambles an output of the code conversion section 76A, which is in a scrambled condition as a result of processing at the scrambler 61A in the main/secondary modulation section 31, back into an original signal.

The timing reproduction section 78A extracts a signal timing from the output of the demodulation section 71A and determines where a signal timing is present. The output of the timing reproduction section 78A is supplied to the roll-off filter 72A and the corresponding inter-face circuit 33.

The carrier detection section 79A detects a carrier to detect whether data have been received, and the output of the carrier detection section 79A is supplied to a sequencer not shown and thus provides trigger information to the sequencer.

Meanwhile, the secondary data demodulation section 57 demodulates secondary data and includes a demodulation section 71B, a roll-off filter (band separation filter) 72B, an automatic gain control section 73B, an automatic equalization section 74B, a carrier phase correction section 75B, a code conversion section 76B, a descrambler section 77B, and a synchronization to start-stop conversion section 80 as well as a timing reproduction section 78B and a carrier detection section 79B.

Here, the synchronization to start-stop conversion section 80 performs conversion processing from a synchronization interface to a start-stop interface, and the demodulation section 71B, the roll-off filter 72B, the automatic gain control section 73B, the automatic equalization section 74B, the carrier phase correction section 75B, the code conversion section 76B, the descrambler section 77B, the timing reproduction section 78B and the carrier detection section 79B have similar functions to those of the demodulation section 71A, the roll-off -filter 72A, the automatic gain control section 73A, the automatic equalization section 74A, the carrier phase correction section 75A, the code conversion section 76A, the descrambler section 77A, the timing reproduction section 78A and the carrier detection section 79A, respectively.

However, the roll-off filter 72B of the secondary data demodulation section 57 need not necessarily have a steep frequency cut-off characteristic since the secondary channel is not divided any more, and accordingly, the roll-off rate (ROF rate) of the roll-off filter 72B is set high in comparison with the roll-off filters 72A for the main channels, for example, to 30 to 40%.

Meanwhile, the timing reproduction section 78B of the secondary data demodulation section 57 extracts a signal timing from the output of the demodulation section 71B and determines where a signal timing is present. Then, the output of the timing reproduction section 78B is supplied to the roll-off filter 72B and the A/D converter 45. Accordingly, the frequency timing of the secondary data is used as a sampling timing for a digital value by the A/D converter 45. The reason why the frequency timing of the secondary data is used as a sampling timing for a digital value by the A/D converter 45 is that the ROF rate in the main channels is so low that it is difficult to extract a timing component from any of the main channels.

It is to be noted that the reception DSP 43 shown in FIG. 3 has the functions of the demodulation sections 71A, the roll-off filters 72A, the automatic gain control sections 73A, the automatic equalization sections 74A, the carrier phase correction sections 75A, the timing reproduction sections 78A and the carrier detection sections 79A of the main data demodulation sections 56-1 to 56-3 and the demodulation section 71B, the roll-off filter 72B, the automatic gain control section 73B, the automatic equalization section 74B, the carrier phase correction section 75B, the timing reproduction section 78B and the carrier detection section 79B of the secondary data demodulation section 57. The reception MPU 41 shown in FIG. 3 has the functions of the code conversion sections 76A and the descramblers 77A of the main data demodulation sections 56-1 to 56-3 and the code conversion section 75B, the descrambler 77B and the synchronization to start-stop conversion section 80 of the secondary data demodulation section 57.

it is to be noted that also the modems 23' serving as child stations have a substantially same construction as the modem 23 serving as the parent station.

An automatic gain control circuit for a demodulation section of a modem according to the present invention is applied to the automatic gain control sections 73A and 73B described above.

While description is given below only of the automatic gain control section 73A, the other automatic gain control section 73B has a similar construction.

Figure 6:
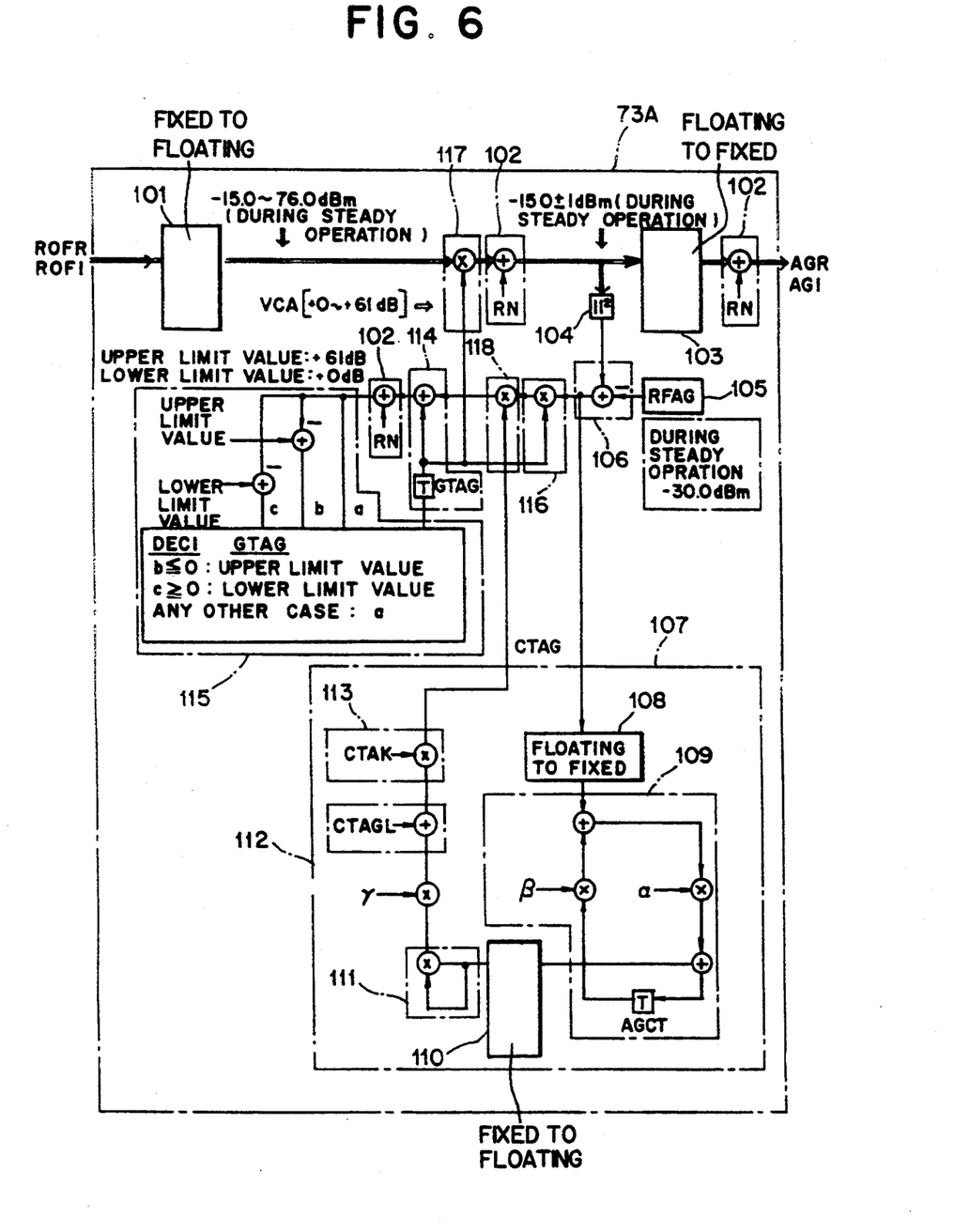
FIG. 6 is a block diagram showing details of the automatic gain control circuit shown in FIG. 3 and showing a preferred embodiment of the present invention.

Referring to FIG. 6, there is shown an automatic gain control circuit, that is, an automatic gain control section, for a demodulation section of a modem according to a preferred embodiment of the present invention. The automatic gain control circuit shown includes fixed to floating point conversion means 101 which converts a fixed point signal inputted thereto from the roll-off filter 72A into a floating point signal which is suitable for calculation when the number of digits varies.

The automatic gain control circuit further includes a plurality of rounding means 102 for limiting the magnitude of an error, floating to fixed point conversion means 103 for converting a floating point signal into a fixed point signal which is suitable for calculation for which a predetermined accuracy is required, output level detection means 104 constituting output level squaring means for squaring the output signal level to the automatic equalization section 74A and inputting the squared output signal level to error calculation means 106, and reference value setting means 105 for setting a predetermined reference value RFAG. The error calculation means 106 calculates an error between output level information of the output level detection means 104 and the reference value RFAG.

The automatic gain control circuit further includes an automatic loop gain control circuit 107 serving as receive revel variation correcting controlling force setting means for setting a receive level variation correcting controlling force CTAG to be multiplied by an error signal calculated by the error calculation means 106. The automatic loop gain control circuit 107 includes floating to fixed point conversion means 108, averaging means 109, fixed to floating point conversion means 110, AGCT squaring means 111, minimum value setting means 112, and CTAK multiplication means 113.

Here, the floating to fixed point conversion means 108 converts a floating point signal into a fixed point signal, and the averaging means 109 averages, using an integration circuit, an error signal outputted from the error calculation means 106 and outputs an averaged error signal AGCT. It is to be noted that, since the averaged error signal AGCT is a fixed point signal, the magnitude of the absolute value of it is limited, for example, to 2 or less, and as a result, also the magnitude of the controlling force CTAG is limited.

The fixed to floating point conversion means 110 converts a fixed point signal into a floating point signal. Meanwhile, the AGCT squaring means 111 squares the value of the averaged error signal AGCT.

The minimum value setting means 112 adds a lower limit value CTAGL of the controlling force CTAG to the output of the AGCT squaring means 111 multiplied by $\gamma$ since, if the value of the controlling force CTAG is excessively low, under flow occurs arid a feedback loop for an output signal level is not formed.

The CTAG calculation means 113 sets a different value CTAK in accordance with a difference in reception mode of the modem, that is, in response to a reception mode of the modem such as, for example, a training pattern reception mode for receiving a training mode or a data reception mode for receiving data, and multiplies the output of the minimum value setting means 112 by the value CTAK.

It is to be noted that, in FIG. 6, $\alpha$ denotes a loop gain controlling force constant, $\beta$ denotes a correction value for the loop, and $\gamma$ is a constant set so that, when the averaged error signal AGCT (which will be hereinafter described in detail) is $\pm 1.0$, the controlling force CTAG may be, for example, 64.

The automatic gain control circuit further includes error signal averaging means 114 for averaging, using an integration circuit, the error signal from the error calculation means 106 corrected in accordance with the controlling force CTAG and a feedback controlling force GTAG (which will be hereinafter described) and outputting the averaged value as a feedback controlling force GTAG. It is to be noted that an initial value of the feedback controlling force GTAG is set, for example, to $+31.1$ dB.

The automatic gain control circuit further includes limiter means 115 for setting an upper limit value and a lower limit value for the input to the error signal averaging means 114, means 116 for multiplying the error signal from the error calculation means 106 by the feedback controlling force GTAG as a correction controlling force, and feedback means 117 for multiplying the signal level of the input signal to the automatic gain control circuit by the feedback controlling force GTAG. The automatic gain control circuit further includes multiplication means 118 serving as error signal correction means for multiplying the error signal from the means 116 by the controlling force CTAG from the automatic loop gain control circuit 107 to correct the error signal.

It is to be noted that, in FIG. 6, RN denotes rounding.

Referring back to FIG. 4, in the modem of the construction described above, upon transmission, individual main data are modulated in the corresponding channels by the main data modulation sections 51-1 to 51-3 while secondary data are modulated in the secondary channel by the secondary data modulation section 52, and the outputs of the modulation sections 51-1 to 51-3 and 52 are added by the adder 53 and then processed by required processing successively by the fixed equalizer 54 and the transmission attenuator 55. The output of the transmission attenuator 55 is converted into an analog signal by tile D/A converter 44 and then sent into the analog circuit 24 (FIG. 2).

Then, on the reception side, a reception signal is converted from an analog signal into a digital signal by the A/D converter 45, and main data of the individual channels of the reception signal are demodulated and reproduced by the main data demodulation sections 56-1 to 56-3 while secondary data of the secondary channel of the reception signal are demodulated and reproduced by the secondary data demodulation section 57.

By the way, a signal inputted from the roll-off filter 72A in each of the main data demodulation sections 56-1 to 56-3 to the automatic gain control section 73A which serves as the automatic gain control circuit is first converted from a fixed point signal into a floating point signal by the fixed to floating point conversion means 101 shown in FIG. 6. Here, the level of the input signal varies, even during steady operation of the modem, within the range of, for example, $-15.0$ to $-76.0$ dBm.

Referring to FIG. 6, the input signal successively undergoes feedback control from the feedback means 117, rounding processing by the rounding means 102, re-conversion into a fixed point signal by the floating to fixed point conversion means 103 and second rounding processing by the rounding means 102, and is then outputted to the automatic equalization section 74A of FIG. 4. In this instance, as a result of the feedback control, the signal level of the output signal of the automatic gain control circuit is adjusted so that it may fall within the range of $-15.0 \pm 1$ dBm (during steady operation).

In particular, while the feedback control from the feedback means 117 described above is performed by multiplying the signal level of the input signal to the automatic gain control circuit by the feedback controlling force GTAG, the feedback controlling force GTAG is calculated by the following operation.

The output signal of the automatic gain control circuit (AGC) is extracted from the input side of the floating to fixed point conversion means 103, and a value obtained by squaring the signal level of the output signal is detected by the output level detection means 104. The output level information detected by the output level detection means 104 is sent to the error calculation means 106, which thus calculates an error between the output level information and a reference value RFAG set by the reference value setting means 105. It is to be noted that the reference value RFAG is set to $-30.0$ dBm during steady operation.

The error signal calculated by the error calculation means 106 is inputted to the automatic loop gain control circuit 107 in order to obtain a receive level variation correcting controlling force CTAG to be multiplied with the error signal.

In the automatic loop gain control circuit 107, the error signal is first converted into a fixed point signal by the floating to fixed point conversion means 108 and then averaged by the averaging means 109 to obtain an averaged error signal ACCT. The averaged error signal AGCT is converted into a floating point signal by the fixed to floating point conversion means 110 and then squared by the AGCT squaring means 111.

The output of the AGCT squaring means 111 is multiplied by $\gamma$ and then added to a lower limit value CTAGL at the minimum value setting means 112, whereafter it is multiplied by a value CTAK corresponding to a reception mode then by the CTAK multiplication means 113, thereby obtaining a controlling force CTAG. It is to be noted that, if it is assumed that the controlling force CTAG is set, for example, almost to 1.0 when the output error of the automatic gain control section is almost 0 dB, then when the output error of the automatic gain control section increases almost to 1 dB, the controlling force CTAG is set, for example, to almost 41 to 61, and when the output error of the automatic gain control section further increases to almost 2 dB, the controlling force CTAG is set to a value higher than, for example, 253.

Meanwhile, the error signal calculated by the error calculation means 106 is multiplied by the feedback controlling force GTAG as a correction controlling force by the multiplication means 116 and then multiplied by the controlling force CTAG by the multiplication means 118, whereafter it is averaged by the integration circuit of the error signal averaging means 114 to make a feedback controlling force GTAG. Here, the output of the error signal averaging means 114 is fed back as another input to the error signal averaging means 114 after it is processed by rounding processing by the rounding means 102 and then limited in value between the upper limit value and the lower limit value set by the limiter means 115.

Due to the operations described above, when the level of the output signal of the automatic gain control section 73A is displaced from −15 dBm, the output signal level is controlled by feedback control with the feedback controlling force GTAG, which increases in proportion to a squared value of the amount of the displacement. Accordingly, when the displacement amount is small, the feedback amount is set to a low value, but when the displacement amount is great, the feedback amount is set to a high value. Consequently, the output signal level can be maintained within the range of −15.0 dBm ±1 dBm immediately in response to a variation of the receive level of the modem.

It is to be noted that also the other automatic gain control section 73B operates similarly as described above.

Consequently, when the receive level varies, since the automatic gain control section follows up such variation rapidly, the level of the automatic equalization section does not exhibit a great variation, and as a result, data communication can be performed without entering a data mode. Accordingly, even if a disturbance to the circuit such as a gain hit or a drop-out occurs, regular communication can be continued without performing a data mode leading-in operation.

It is to be noted that, while the embodiment described above is applied to a modem which employs a multi-point connection technique wherein a frequency band of a main channel is divided into a plurality of frequency bands so that a plurality of data are transmitted by way of the same circuit, the spirit and scope of the present invention can naturally be applied similarly to a modem of any other type.

The present invention is not limited to the specifically described embodiment, and variations and modifications may be made without departing from the scope of the present invention.

What is claimed is:

1. An automatic gain control circuit, provided in a demodulation section of a modem, for adjusting a loop gain so that a level of a band-limited receive signal input to the automatic gain control circuit may have a predetermined reference value and, in response, outputting an output signal to an automatic equalization section of the modem, the automatic gain control circuit comprising:
reference value setting means for setting a reference value;
error calculation means for calculating an error signal between information of a level of the output signal of said automatic gain control circuit corresponding to the receive signal and the reference value of said reference value setting means;
receive level variation correcting controlling force setting means for setting a receive level variation correcting controlling force to be added to the error signal calculated by said error calculation means;
error signal correction means for correcting the error signal from said error calculation means with the receive level variation correcting controlling force set by said receive level variation correcting controlling force setting means and, in response, generating a corrected error signal;
error signal averaging means for averaging the corrected error signal from said error signal correction means, and, in response, generating an averaged corrected error signal;
feedback means for feeding back the averaged corrected error signal from said error signal averaging means to the receive signal; and
the receive level variation correcting controlling force set by said receive level variation correcting controlling force setting means being varied in response to the error signal from said error calculation means.

2. An automatic gain control circuit as claimed in claim 1, wherein said receive level variation correcting controlling force setting means comprises:
averaging means for averaging the error signal calculated by said error calculation means and, in response, generating an averaged error signal; and
averaged error signal squaring means for squaring the averaged error signal averaged by said averaging means to generate a squared error signal, and for outputting the squared error signal as the receive level variation correcting controlling force.

3. An automatic gain control circuit as claimed in claim 2, wherein said receive level variation correcting controlling force setting means further comprises minimum value setting means provided on an output side of said averaged error signal squaring means for setting a minimum value of the squared error signal so that the squared error signal may not be lower than the minimum value.

4. An automatic gain control circuit as claimed in claim 2, wherein said receive level variation correcting controlling force setting means further comprises means provided on an output side of said averaged error signal squaring means for setting a different value of the squared signal depending upon a particular one of reception modes of the modem.

5. An automatic gain control circuit as claimed in claim 2, wherein said receive level variation correcting controlling force setting means further comprises:
minimum value setting means provided on an output side of said averaged error signal squaring means for setting a minimum value of the squared error signal so that the squared error signal may not be lower than the minimum value; and
means provided on the output side of said averaged error signal squaring means for setting a different value of the squared error signal depending upon a particular one of reception modes of the modem.

6. An automatic gain control circuit as claimed in claim 1, further comprising squaring means for squaring the information of the level of the output signal before the information of the level of the output signal is input to said error calculation means.

7. An automatic gain control circuit as claimed in claim 1, further comprising limiter means for setting an upper limit value and a lower limit value of the corrected error signal.

8. An automatic gain control circuit as claimed in claim 1, further comprising means for adding the averaged error signal from said error signal averaging means, as the receive level variation correcting controlling force, to the error signal calculated by said error calculation means.

9. An automatic gain control circuit, provided in a demodulation section of a modem, for adjusting a loop gain so that a level of a band-limited receive signal input to the automatic gain control circuit may have a predetermined reference value and, in response, outputting an output signal to an automatic equalization section of the modem, the automatic gain control circuit comprising:

reference value setting means for setting a reference value;

error calculation means for calculating an error signal between information of a level of the output signal of said automatic gain control circuit corresponding to the receive signal and the reference value of said reference value setting means;

averaging means for averaging the error signal calculated by said error calculation means and, in response, generating an averaged error signal;

averaged error signal squaring means for squaring the averaged error signal averaged by said averaging means to generate a squared error signal, and for outputting the squared error signal as a receive level variation correcting controlling force;

error signal correction means for correcting the error signal from said error calculation means with the receive level variation correcting controlling force; and feedback means for feeding back the error signal corrected by said error signal correction means to the receive signal.

10. An automatic gain control circuit, provided in a demodulation section of a modem, for adjusting a loop gain so that a level of a band-limited receive signal input to the automatic gain control circuit may have a predetermined reference value and, in response, outputting an output signal to an automatic equalization section of the modem, the automatic gain control circuit comprising:

reference value setting means for setting a reference value;

squaring means for squaring information of a level of the output signal to generate a squared output value;

error calculation means for calculating an error signal between the squared output value and the reference value of said reference value setting means;

receive level variation correcting controlling force setting means for setting a receive level variation correcting controlling force to be added to the error signal calculated by said error calculation means;

error signal correction means for correcting the error signal from said error calculation means with the receive level variation correcting controlling force set by said receive level variation correcting controlling force setting means; and feedback means for feeding back the error signal corrected by said error signal correction means to the receive signal.

11. An automatic gain control circuit as claimed in claim 10, wherein said receive level variation correcting controlling force setting means further comprises minimum value setting means provided on an output side of said averaged error signal squaring means for setting a minimum value of the squared error signal so that the squared error signal may not be lower than the minimum value.

12. An automatic gain control circuit as claimed in claim 9, wherein said receive level variation correcting controlling force setting means further comprises means provided on an output side of said averaged error signal squaring means for setting a different value of the squared signal depending upon a particular one of reception modes of the modem.

13. An automatic gain control circuit as claimed in claim 9, wherein said receive level variation correcting controlling force setting means further comprises:

minimum value setting means provided on an output side of said averaged error signal squaring means for setting a minimum value of the squared error signal so that the squared error signal may not be lower than the minimum value; and means provided on the output side of said averaged error signal squaring means for setting a different value of the squared error signal depending upon a particular one of reception modes of the modem.

* * * * *

UNITED STATES PATENT AND TRADEMARK OFFICE
CERTIFICATE OF CORRECTION

PATENT NO. : 5,448,595
DATED : September 5, 1995
INVENTOR(S) : Takashi KAKU et al.

It is certified that error appears in the above-indentified patent and that said Letters Patent is hereby corrected as shown below:

Column 2, line 14, ", however" should be –. However–; and line 64, "in" should be –In–.

Column 4, line 14, delete "FIG," and insert –FIG.–.

Column 6, line 47, change "the;" to –the–.

Column 8, line 68, "inter-face" should be –interface–.

Column 9, line 25, "roll-off -filter" should be –roll-off filter–.

Column 10, line 67, "under flow" should be –underflow–.

Column 16, line 18, delete "10" and insert –9–.

Column 10, line 67, "arid" should be ––and––.

Signed and Sealed this

Ninth Day of January, 1996

Attest:

BRUCE LEHMAN

*Attesting Officer*     *Commissioner of Patents and Trademarks*